(12) United States Patent
Nakamura

(10) Patent No.: US 6,399,466 B2
(45) Date of Patent: *Jun. 4, 2002

(54) METHOD OF MANUFACTURING NON-VOLATILE SEMICONDUCTOR MEMORY DEVICE STORING CHARGE IN GATE INSULATING LAYER THEREIN

(75) Inventor: Akihiro Nakamura, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/730,016

(22) Filed: Oct. 11, 1996

(30) Foreign Application Priority Data

Oct. 13, 1995 (JP) .............................. 7-265834

(51) Int. Cl.⁷ .......................................... H01L 21/4763
(52) U.S. Cl. ....................... 438/591; 438/287; 438/289; 438/585
(58) Field of Search ................. 438/591, 289, 438/954, 287, 225, 257, 261, 263, 264, 276, 288, 291, 301, 303, 305, 306, 307, 594, 585, 586, 523, 217, 290, 597, 622

(56) References Cited

U.S. PATENT DOCUMENTS

| | | | |
|---|---|---|---|
| 4,313,782 A | * 2/1982 | Sokoloski | 438/591 |
| 4,356,622 A | * 11/1982 | Widmann | 438/289 |
| 4,441,247 A | * 4/1984 | Gargini et al. | 438/289 |
| 4,642,878 A | * 2/1987 | Maeda | 438/305 |
| 5,147,813 A | * 9/1992 | Woo | 438/263 |
| 5,168,334 A | * 12/1992 | Mitchell et al. | 257/324 |
| 5,238,863 A | * 8/1993 | Fukusho et al. | 438/591 |
| 5,324,675 A | * 6/1994 | Hayabuchi | 438/591 |
| 5,399,514 A | * 3/1995 | Ichikawa | 438/231 |
| 5,403,764 A | * 4/1995 | Yamamoto et al. | 438/257 |
| 5,436,481 A | * 7/1995 | Egawa et al. | 438/591 |
| 5,474,940 A | * 12/1995 | Tsukamoto | 438/289 |
| 5,496,753 A | * 3/1996 | Sakurai et al. | 438/591 |
| 5,607,868 A | * 3/1997 | Chida et al. | 438/258 |
| 5,661,071 A | * 8/1997 | Chor | 438/954 |
| 5,668,065 A | * 9/1997 | Lin | 438/303 |

* cited by examiner

Primary Examiner—Chandra Chaudhari
Assistant Examiner—Jack Chen
(74) Attorney, Agent, or Firm—Sonnenschein, Nath & Rosenthal (57) ABSTRACT

A method of manufacturing a non-volatile semiconductor memory device having a gate insulating layer composed of a first silicon oxide layer, a silicon nitride layer, and a second silicon oxide layer and a gate electrode, comprising the steps of forming the gate insulating layer on a semiconductor substrate, introducing an impurity into a channel region of the semiconductor substrate after forming the gate insulating layer, or forming a gate electrode on the gate insulating layer.

4 Claims, 7 Drawing Sheets

FIG. 1

PRIOR ART

METHOD OF MANUFACTURING NON-VOLATILE SEMICONDUCTOR MEMORY DEVICE STORING CHARGE IN GATE INSULATING LAYER THEREIN

BACKGROUND OF THE INVENTION

1. Field of the Invention

The present invention relates to a method of manufacturing an electrically programmable non-volatile semiconductor memory device. More particularly, it relates to a method of manufacturing a non-volatile semiconductor memory device with a threshold voltage which is controlled by impurity implantation in a channel region.

2. Description of the Related Art

In recent years, there has been much activity in development of flash EEPROMs. There are now mainly two types of flash memory EEPROMs. One is the floating gate type flash EEPROM, which can erase and program data by controlling the charge stored in a floating gate formed between a gate insulating layer and a controlling gate via an insulating layer.

The other is the metal-oxide-nitride-oxide-semiconductor (MONOS) type flash EEPROM, which can erase and program data by controlling the charge stored in a gate insulating layer including a nitride layer.

Further, flash EEPROMs may be classified by the arrangement of the memory cell or the means for programming into a common-source, parallel-array type (NOR type), a separate-source, parallel-array type (AND type), a series type (NAND type), a divided-bit-line, parallel array type (DINOR type), and so on.

A flash memory requires implantation of impurities into a channel region in order to control the threshold voltage or to make a depletion mode transistor. However, the impurities doped in the channel region are re-diffused by the heating process after forming the gate insulating layer, so the profile of the impurities is modified. This prevents the fabrication of high density memory devices.

A MONOS type flash memory, in particular, requires a depletion mode transistor, so punch through occurs easily and makes fabrication of a high density memory device difficult.

SUMMARY OF THE INVENTION

An object of the present invention is to provide a method of manufacturing a nonvolatile semiconductor memory device which can maintain its impurity profile in its channel region and therefore enables fabrication of a high density memory device.

According to one aspect of the present invention, there is provided a method of manufacturing a non-volatile semiconductor memory device having a gate insulating layer composed of a first silicon oxide layer, a silicon nitride layer, and a second silicon oxide layer and a gate electrode, comprising the steps of forming the gate insulating layer on a semiconductor substrate, introducing an impurity into a channel region of the semiconductor substrate after forming the gate insulating layer, and forming a gate electrode on the gate insulating layer.

According to another aspect of the present invention, there is provided a method of manufacturing a non-volatile semiconductor memory device having a gate insulating layer composed of a first silicon oxide layer, a silicon nitride layer, and a second silicon oxide layer and a gate electrode, comprising the steps of forming the gate insulating layer on a semiconductor substrate, forming a polycrystalline silicon layer composed of the gate electrode on the gate insulating layer, and introducing an impurity into a channel region of the semiconductor substrate after forming the polycrystalline silicon layer.

BRIEF DESCRIPTION OF THE DRAWINGS

These and other objects and features of the present invention will become clear from the following description of the present invention referring to the accompanying drawings, in which.

DESCRIPTION OF THE PREFERRED EMBODIMENTS

Before describing the preferred embodiments of the present invention, the related arts will be described for background with reference to the drawings.

Figure 1:
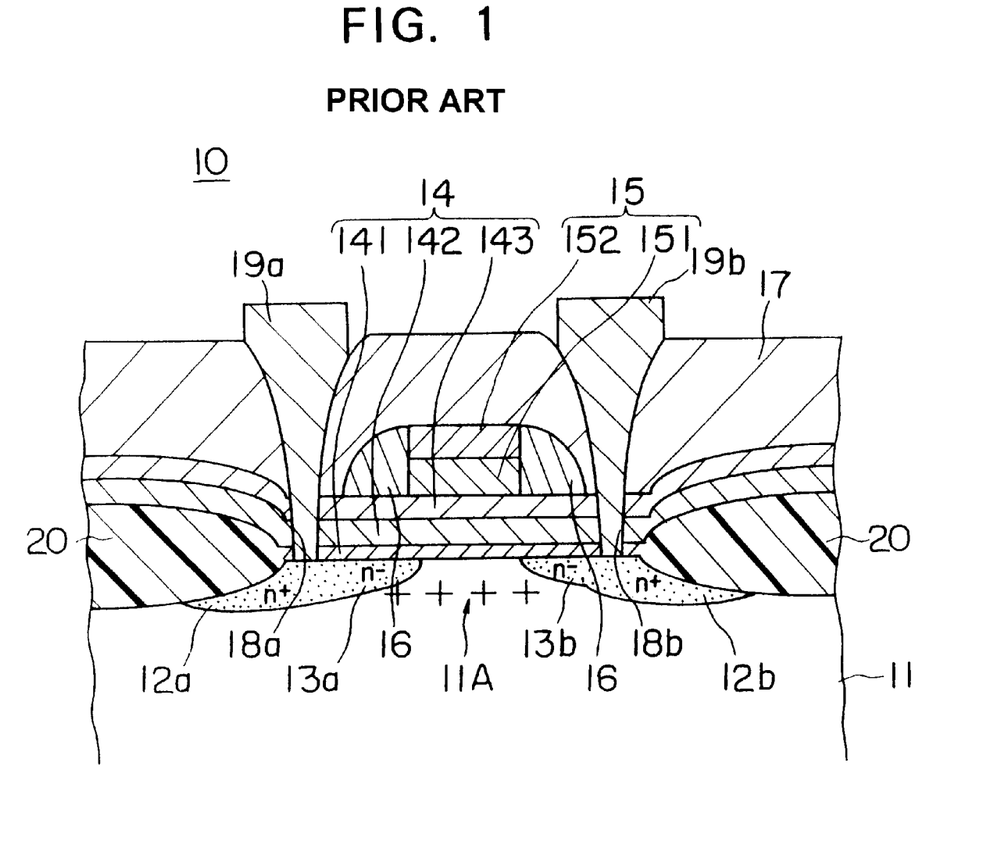
FIG. 1 is a sectional view of a memory cell of a MONOS type non-volatile semiconductor memory device.

FIG. 1 is a view showing the basic configuration of a MONOS type non-volatile semiconductor memory device.

As shown in FIG. 1, the MONOS type non-volatile semiconductor memory device 10 has two n$^+$ diffusion regions 12a, 12b and two n$^-$ diffusion regions which serve as the source and drain in a semiconductor substrate, a gate insulating layer 14 formed on the substrate layer 11, and a control gate 15 formed on the gate insulating layer 14. Side walls 16 are formed on each side of the control gate 15 and an insulating layer 17 covers the gate insulating layer 14, control gate 15, and side walls 16. Interconnections 19a, 19b composed of aluminum are connected to the n$^+$ diffusion regions 12a, 12b via contact holes 18a, 18b formed through the insulating layer 17. An n$^+$ impurity such as phosphorus is implanted in a channel region 11A in the substrate 11 to control the threshold voltage or to create a depletion mode transistor. In FIG. 1, reference numeral 20 shows a junction isolation area (LOCOS).

The gate insulating layer 14 is composed of a first oxide layer (tunnel oxide) 141 which is composed of SiO$_2$, a silicon nitride (Si$_3$N$_4$) layer 142 on the first oxide layer 141, and a second oxide layer 143 which is composed of SiO$_2$ on the silicon nitride layer 142.

The control gate 15 is composed of a polycrystalline silicon layer 151 and a refractory metal silicide layer 152 such as tungsten.

Data is stored in the MONOS type non-volatile semiconductor memory by the accumulation of a charge in the silicon nitride layer 142 of the gate insulating layer 14. The threshold voltage in the write and erase mode is controlled, that is, the amount of the charge is controlled, by changing the voltage applied to the control gate 15.

Next, referring to FIGS. 2A to 2I, a method of manufacturing the MONOS non-volatile semiconductor device 10 described above as a related art will be explained.

Figure 2A:
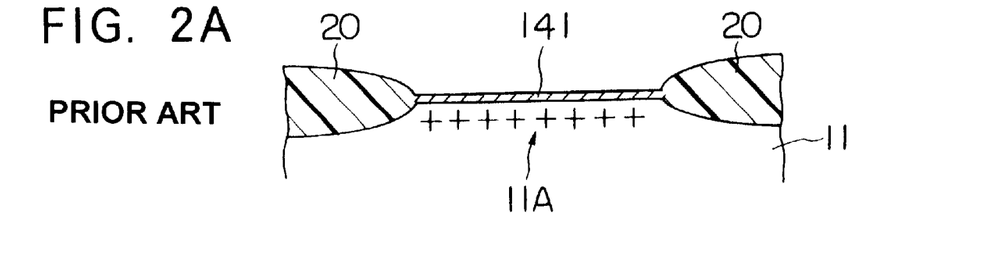
FIGS. 2A to 2I are sectional views of a memory cell of a MONOS type non-volatile semiconductor memory device at various stages of a manufacturing method in the related art.

First, as shown in FIG. 2A, a field oxide layer 20 is grown on the substrate 11 to a thickness of 400 nm by thermal oxidation of the substrate 11 at 950° C. for about 4 hours.

Next, an n-type impurity such as phosphorus is implanted in the substrate 11 between the field oxide layers 20.

The oxide layer on the substrate 11 between the field oxide layers 20 is removed, then a tunnel oxide layer 141 is grown to a thickness of 2 nm by thermal oxidation at 750° C. for about 1 minute.

Figure 2B:
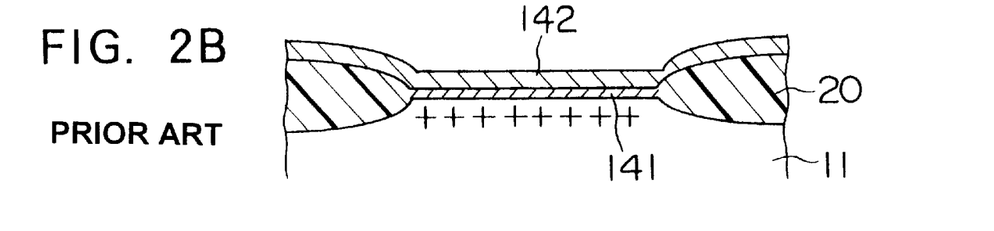

As shown in FIG. 2B, a silicon nitride layer 142 is deposited on the tunnel oxide layer 141 to a thickness of 5 to 20 nm by low pressure chemical vapor deposition.

Figure 2C:
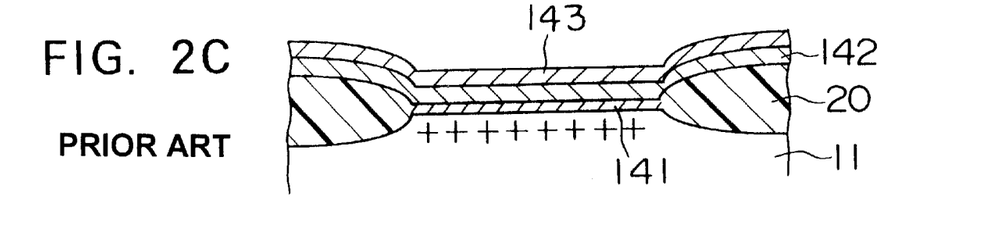

Next, as shown in FIG. 2C, a top oxide layer 143 is formed to a thickness of 4 nm by thermal oxidation of the surface of the silicon nitride layer 142, using, for example, pyrogenic oxide at 950° C. for 50 minutes.

Figure 2D:
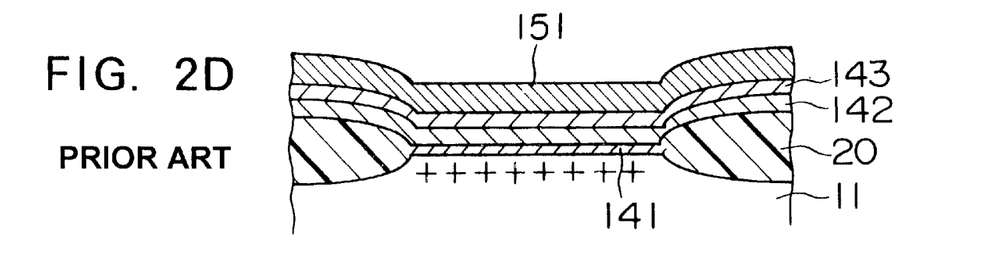

Next, as shown in FIG. 2D, a polycrystalline silicon layer 151 of the control gate 15 is deposited by the CVD method etc. The thickness of the polycrystalline silicon layer 151 is not limited, but is preferably less than about 200 nm.

Figure 2E:
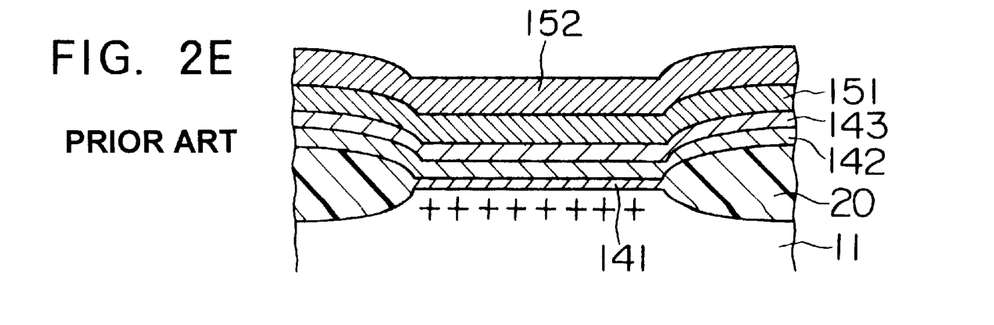

As shown in FIG. 2E, after forming the polycrystalline silicon layer 151, a tungsten silicide layer 152 is formed on the polycrystalline silicon layer 151 by the CVD method.

Figure 2F:
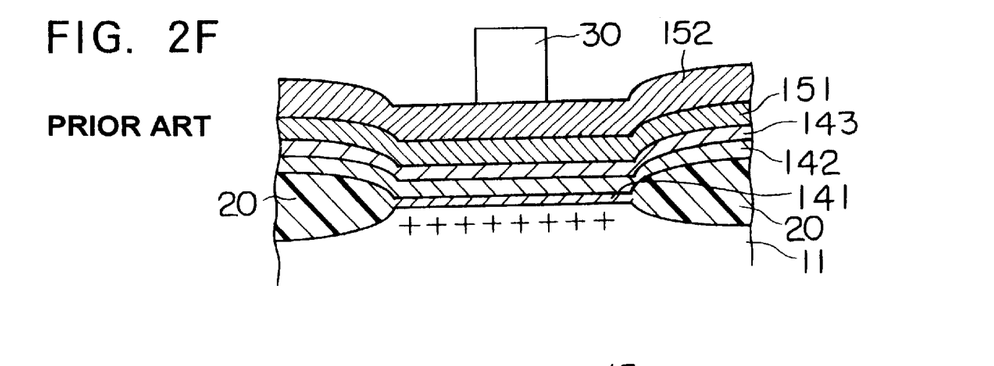
Figure 2G:
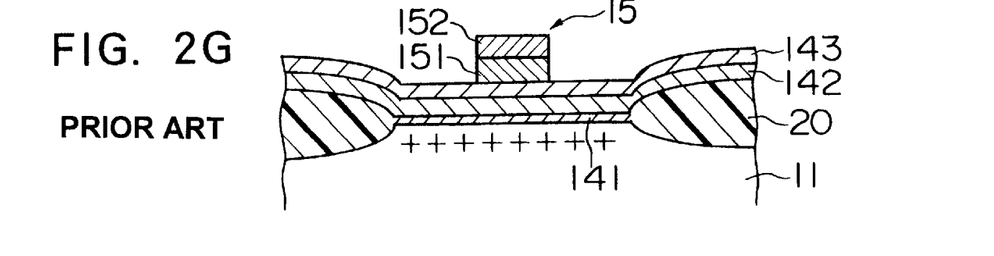

Next, as shown in FIG. 2F, a mask 30 is formed on the area where the gate electrode is to be formed, then the control gate 15 is patterned in the shape of a gate electrode as shown in FIG. 2G by etching, using reactive ion etching (RIE) etc., the silicide layer 152 and the polycrystalline silicon layer 151.

Figure 2H:
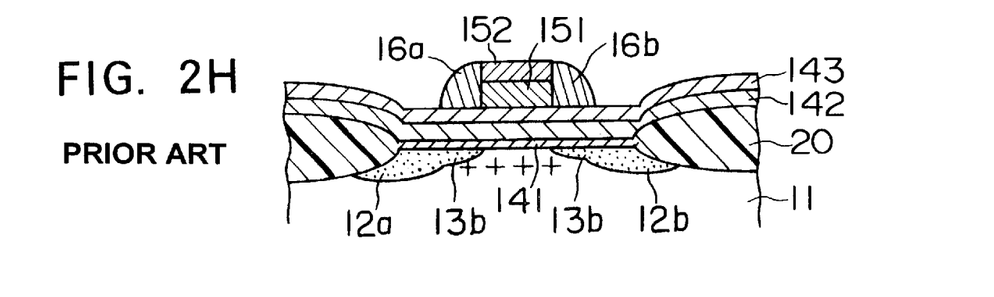

Next, as shown in FIG. 2H, n-type ions (n$^-$) such as phosphorus (P) or arsenic (As) are implanted, whereby low impurity concentration regions 13a, 13b serving as the LDD are created. Then a silicon oxide layer is deposited by CVD and etched by anisotropic etching, so side walls are formed beside the gate insulating layer 14.

n$^+$ type ions such as phosphorus (P) or arsenic (As) are implanted at 25 keV at a dosage of $1\times10^{15}$ /cm$^2$ to $5\times10^{15}$/cm$^2$, whereby high impurity concentration regions 12a, 12b serving as the source and drain are created.

Then annealing is performed to activate the impurities.

Figure 2I:
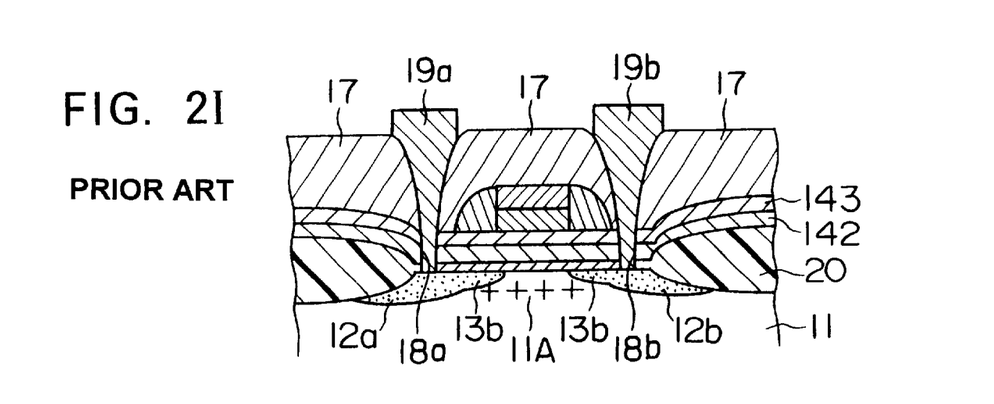

Next, as shown in FIG. 2I, after forming the insulating layer 17 on the surface of the substrate, contact holes 18a, 18b are formed through the insulating layer 17 to reach the n$^+$ diffusion regions 12a, 12b, and aluminum interconnections 19a, 19b are formed, whereby the non-volatile semiconductor memory device 10 as shown in FIG. 1 is completed.

The forming-annealing process is performed at 400° C. for about 60 minutes.

Figure 3:
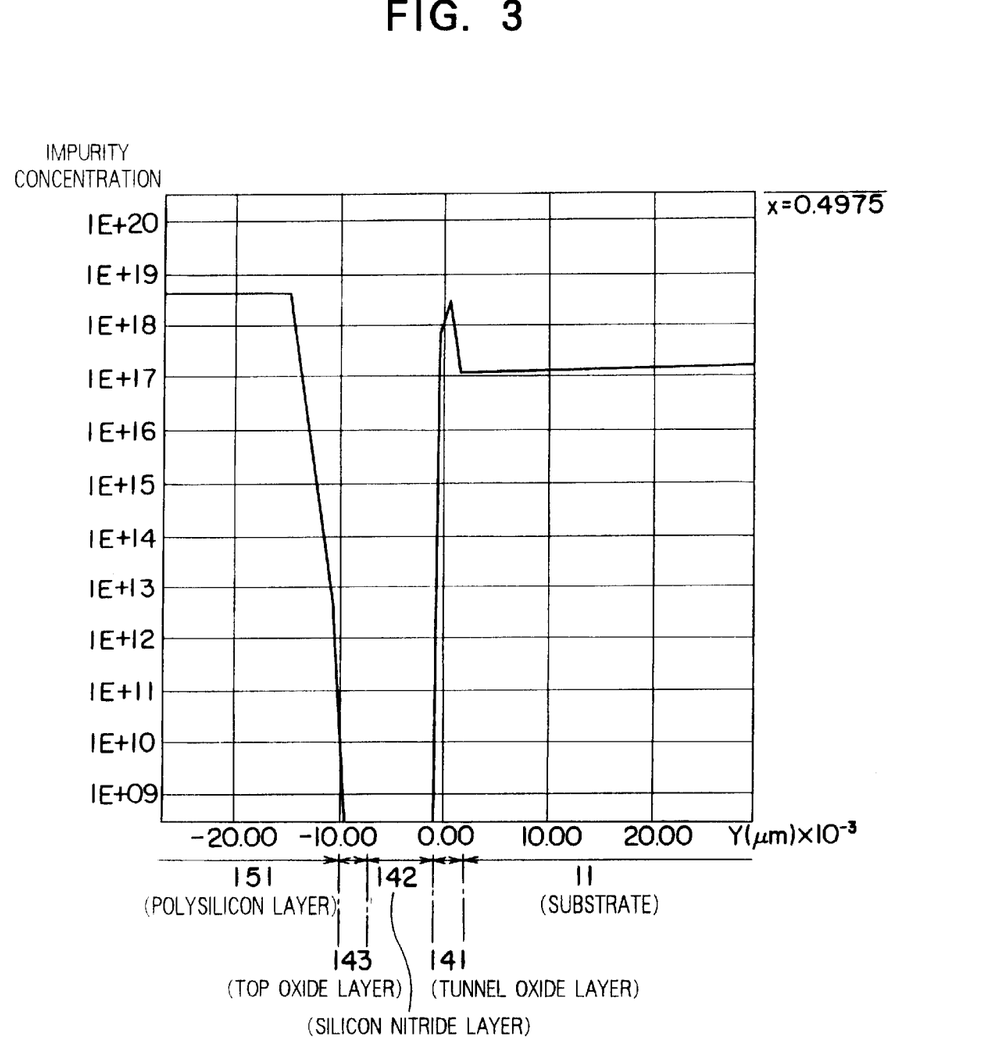
FIG. 3 is a view showing the impurity profile in the MONOS type non-volatile semiconductor memory device shown in FIGS. 2A to 2I.

The method of manufacturing the MONOS type non-volatile semiconductor memory device shown in FIGS. 2A to 2I has disadvantages, however. Since the impurities are implanted into the channel region 11A before forming the gate insulating layer 14, the impurity profile of the channel region may become distorted as shown in FIG. 3 due to the heat process for forming the gate insulating layer 14.

This disadvantage will be explained in more detail as follows. The top oxide layer 143 of the gate insulating layer 14 is formed by thermal oxidation of the silicon nitride layer 142. The thickness of the top oxide layer 143 must be about 2 to 6 nm in a MONOS type non-volatile semiconductor memory device. The heat process to produce the top oxide layer 143 should processing at 950° C. for 30 to 80 minutes. It is necessary to maintain the impurity profile in the channel region 11A in the case of a semiconductor device having fine dimensions, but the profile may become distorted when forming the top oxide layer 143. This prevents the formation of a high density memory device.

A MONOS type in particular requires a depletion type transistor, so punch-through occurs easily and reduction of the cell size is harder than another type of memory device.

Next, a preferred embodiment of method of manufacturing a MONOS type semiconductor memory device according to the present invention will be described with reference to FIGS. 4A to 4I.

Figure 4A:
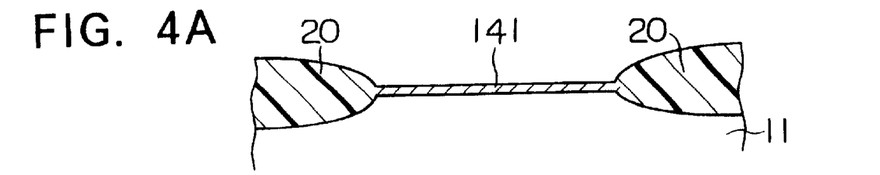
FIGS. 4A to 4I are cross-sectional views of a memory cell of the MONOS type non-volatile semiconductor memory device shown in FIG. 1 at other stages of the manufacturing method according to the present invention.

First, as shown in FIG. 4A, a field oxide layer 20 is formed on the substrate 11 to a thickness of 400 nm by thermal oxidation of the substrate 11 at 950° C. for about 4 hours.

The oxide layer on the surface of the substrate 11 between the field oxide layers 20 is removed, then a tunnel oxide layer 141 is grown to a thickness of 2 nm by thermal oxidation at 750° C. for about 1 minute.

Figure 4B:
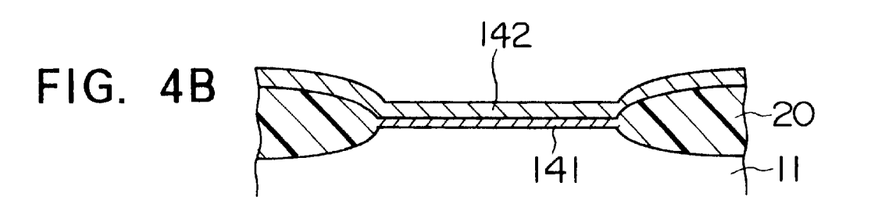

As shown in FIG. 4B, a silicon nitride layer 142 is deposited on the tunnel oxide layer 141 to a thickness of 5 to 20 nm by low pressure chemical vapor deposition.

Figure 4C:
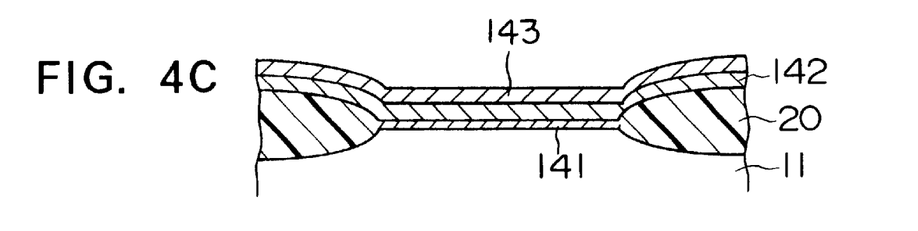

Next, as shown in FIG. 4C, a top oxide layer 143 is formed to a thickness of 4 nm by thermal oxidation for oxidizing the surface of the silicon nitride layer 142 using for example pyrogenic oxide at 950° C. for 50 minutes.

Figure 4D:
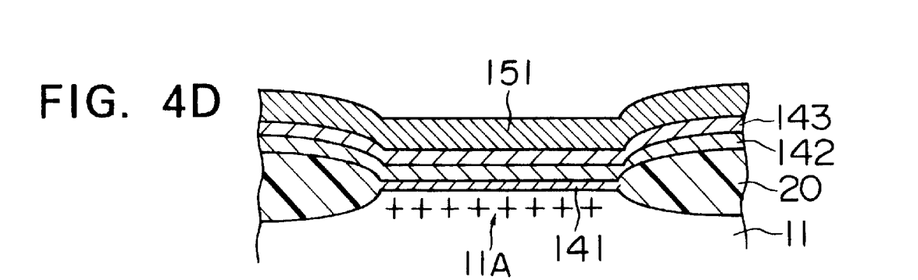

Next, as shown in FIG. 4D, the polycrystalline silicon layer 151 of the control gate 15 is formed by CVD etc. The thickness of the polycrystalline silicon layer 151 is not limited, but preferably is less than about 200 nm.

Next, an impurity such as phosphorus is implanted at a dosage of $3.0\times10^{12}$/cm$^2$ at an energy of 35 keV in the substrate 11 between the field oxide layers 20.

Figure 4E:
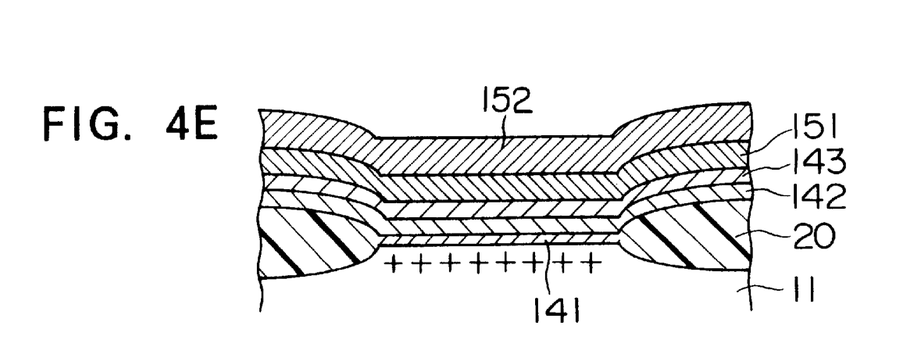

As shown in FIG. 4E, a tungsten silicide layer 152 is formed on the polycrystalline silicon layer 151 by CVD.

Figure 4F:
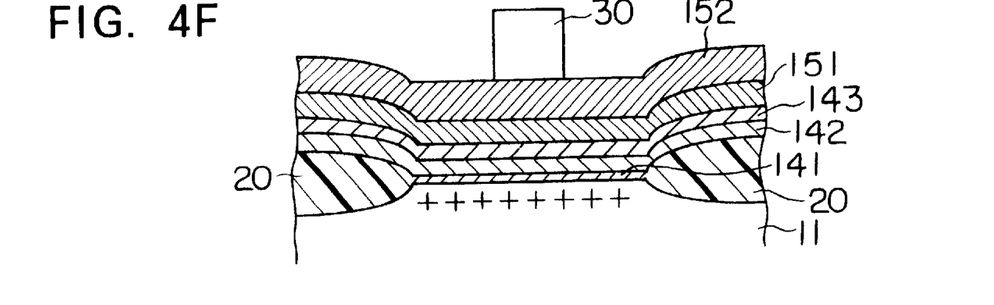
Figure 4G:
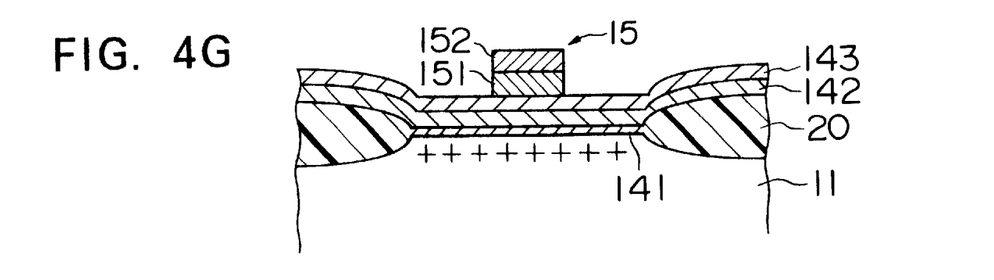

Next, as shown in FIG. 4F, a mask 30 is formed on the area where the gate electrode is to be formed, then the control gate 15 is patterned in the shape of a gate electrode as shown in FIG. 4G by etching the silicide layer 152 and the polycrystalline silicon layer 151 using for example RIE.

Figure 4H:
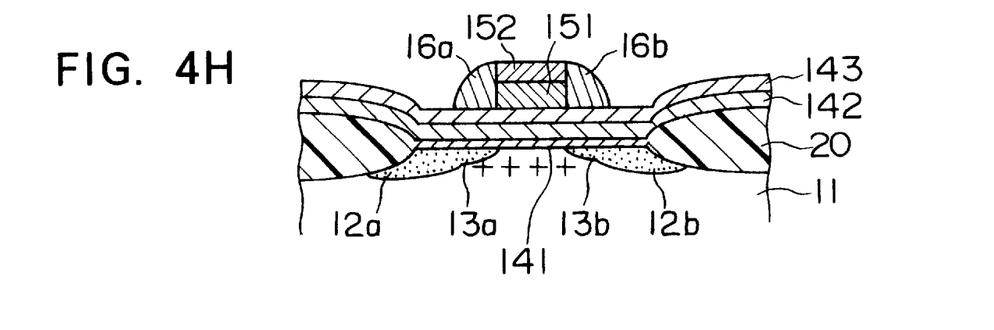

Next, as shown in FIG. 4H, n-type ions (n$^-$) such as phosphorus (P) or arsenic (As) are implanted, whereby low impurity concentration regions 13a, 13b serving as LDD are formed. Then, a silicon oxide layer is deposited by CVD and etched by anisotropic etching, whereby side walls 16a, 16b are formed on each side of the gate insulating layer 14.

n$^+$ type ions such as phosphorus (P) or arsenic (As) are implanted at 25 keV at a dosage of $1\times10^{15}$ to $5.0\times10^{15}$/cm$^2$, whereby high impurity concentration regions 12a, 12b serving as the source and drain are created.

Then, annealing is performed to activate the impurities.

Figure 4I:
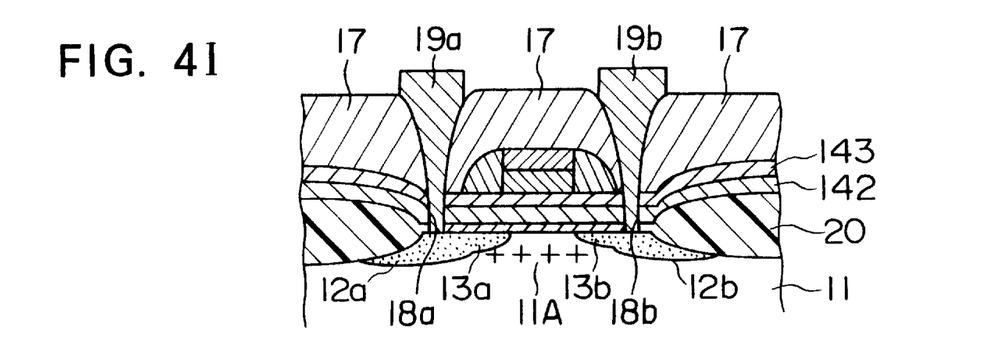

Next, as shown in FIG. 4I, an insulating layer 17 is formed on the surface of the substrate, contact holes 18a, 18b are formed through the insulating layer 17 to reach the n$^+$ diffusion regions 12a, 12b, and aluminum interconnections 19a, 19b are formed, thereby completing the non-volatile semiconductor memory device 10 as shown in FIG. 1.

A forming-annealing process is performed at 400° C. for about 60 minutes.

Figure 5:
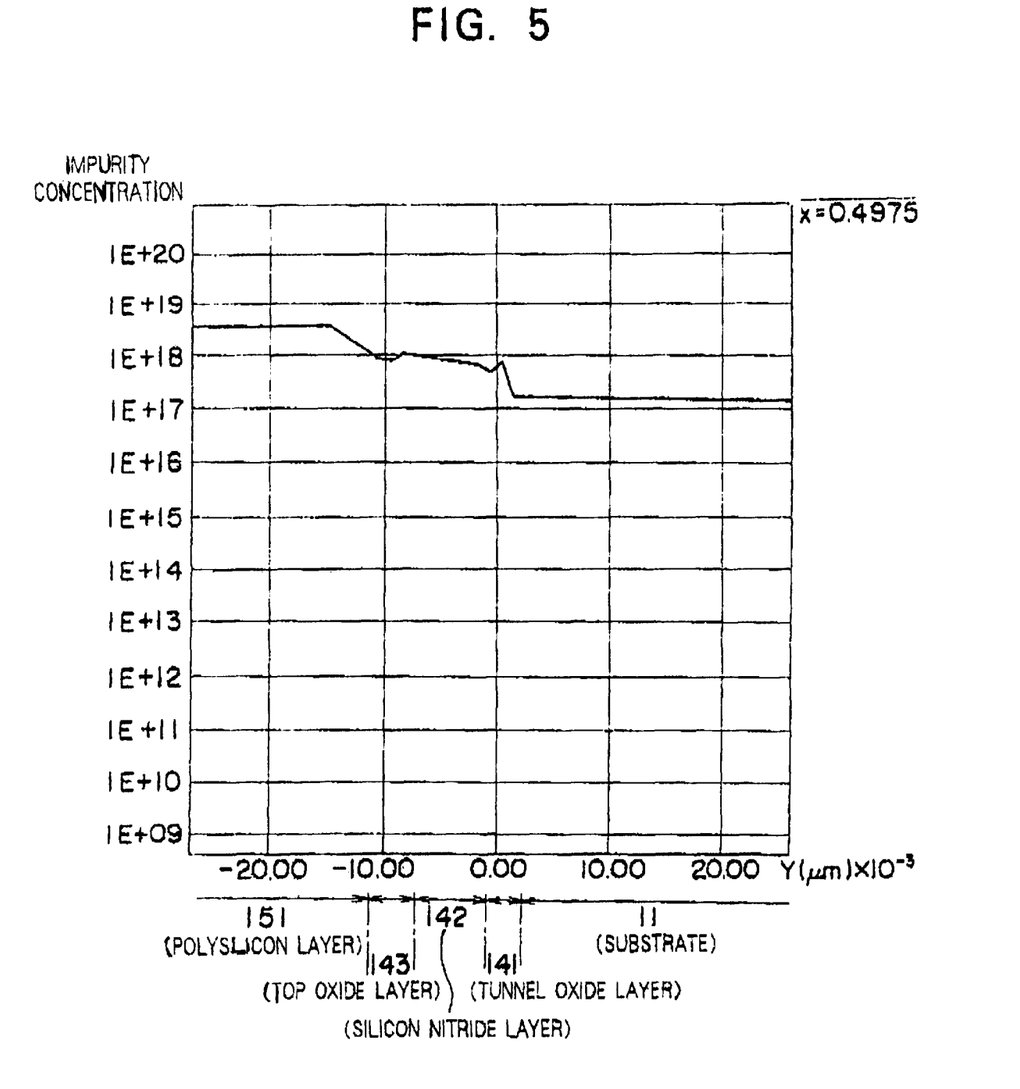
FIG. 5 is a view showing the impurity profile in the MONOS type non-volatile semiconductor memory device shown in FIGS. 4A to 4I.

The MONOS type non-volatile semiconductor memory device fabricated as described above maintains its impurity profile as shown in FIG. 5 and includes the impurity in its gate insulating layer 14 at a concentration of $1\times10^{17}$ to $1\times10^{18}/cm^3$ in contrast with the device of a related art shown in FIG. 3.

The MONOS type non-volatile semiconductor memory device fabricated by the process described in FIGS. 4A to 4I displays the same data retention as the MONOS type non-volatile semiconductor memory device fabricated by the process described in FIGS. 2A to 2I.

As described above, according to the embodiment shown in FIGS. 4A to 4I, an impurity is implanted in the channel region 11A after forming the gate insulating layer 14 and the polycrystalline silicon layer 151 constituting the control gate 15, so this MONOS type non-volatile semiconductor memory device has the advantages that the impurity profile in the channel region 11A can be maintained and the size of the memory cells can be reduced.

In addition, the impurity is introduced into the channel region 11A after forming the polycrystalline silicon layer 151, so a hydrofluoric acid solution can be used for later cleaning and contamination with organic compounds and heavy metals can be avoided.

Further, there is the advantage that the silicon nitride layer 142 sustains damage by the ion implantation etc., which increases the traps in the silicon nitride layer 142.

In the above embodiment, the impurity implantation was conducted after forming the gate insulating layer 14, but this can also be done after forming the polycrystalline silicon layer 151 constituting the gate electrode 15.

Note that the present invention is not limited to the above embodiments and can be modified in various ways within the scope of the present invention.

What is claimed is:

1. A method of manufacturing a MONOS-type non-volatile semiconductor memory comprising the steps of:

first forming a gate insulating layer on a semiconductor substrate by forming a first silicon oxide layer on the surface of the substrate, forming a silicon nitride layer on the first silicon oxide layer and forming a second silicon oxide layer on the silicon nitride layer, wherein the second silicon oxide layer is formed by thermal oxidation of an outer surface of the silicon nitride layer, thereafter, forming a gate electrode layer on the gate insulating layer, which gate electrode layer is formed into a gate electrode in a later step, thereafter, introducing an impurity into a channel region of the semiconductor substrate disposed under the gate insulating layer and under a gate region after forming the gate insulating layer and the gate electrode layer, and pattering the gate electrode layer into a gate electrode.

2. The method of claim 1, comprising the further step of forming a refractory metal layer on the gate electrode layer before the gate electrode layer is patterned into the gate electrode.

3. The method of claim 1, wherein the gate electrode layer comprises a polycrystalline silicon layer.

4. The method of claim 1, wherein the impurity is introduced into the channel region at a dosage of $3.0\times10^{12}/cm^2$ at an energy of 35 kev.

* * * * *